(12) United States Patent
Wu et al.

(10) Patent No.: US 11,303,251 B2
(45) Date of Patent: Apr. 12, 2022

(54) DIGITAL PREDISTORTION ADJUSTMENT BASED ON DETERMINATION OF LOAD CONDITION CHARACTERISTICS

(71) Applicant: NanoSemi, Inc., Waltham, MA (US)

(72) Inventors: Yu-Chen Wu, Bedford, MA (US); Yanyu Huang, Bedford, MA (US); Zohaib Mahmood, Westwood, MA (US); Helen H. Kim, Sudbury, MA (US)

(73) Assignee: NanoSemi, Inc., Waltham, MA (US)

( * ) Notice: Subject to any disclaimer, the term of this patent is extended or adjusted under 35 U.S.C. 154(b) by 0 days.

(21) Appl. No.: 16/753,143

(22) PCT Filed: Oct. 1, 2018

(86) PCT No.: PCT/US2018/053739
§ 371 (c)(1),
(2) Date: Apr. 2, 2020

(87) PCT Pub. No.: WO2019/070573
PCT Pub. Date: Apr. 11, 2019

(65) Prior Publication Data
US 2020/0259465 A1 Aug. 13, 2020

Related U.S. Application Data

(60) Provisional application No. 62/566,946, filed on Oct. 2, 2017.

(51) Int. Cl.
*H03F 1/32* (2006.01)
*H03F 3/24* (2006.01)
(Continued)

(52) U.S. Cl.
CPC ......... *H03F 1/3247* (2013.01); *H03F 1/3258* (2013.01); *H03F 1/3294* (2013.01);
(Continued)

(58) Field of Classification Search
CPC .... H03F 1/3247; H03F 1/3258; H03F 1/3294; H03F 1/245; H03F 2200/451;
(Continued)

(56) References Cited

U.S. PATENT DOCUMENTS

| | | |
|---|---|---|
| 4,979,126 A | 12/1990 | Pao et al. |
| 5,819,165 A | 10/1998 | Hulkko et al. |

(Continued)

FOREIGN PATENT DOCUMENTS

| | | |
|---|---|---|
| CN | 1938939 A | 3/2007 |
| CN | 101379718 A | 3/2009 |

(Continued)

OTHER PUBLICATIONS

Liu Youjiang et al.: Concurrent Dual-Band Digital Predistortion with a Single Feedback Loop:, IEEE Transactions on Microwave Theory and Techniques, Plenum, USA, vol. 63, No. 5, May 1, 2015 (May 1, 2015), pp. 1556-1568, XP011580127, ISSN: 0018-9480, DOI: 10.1109/TMTT.2015.2417158.

(Continued)

*Primary Examiner* — Kevin M Burd
(74) *Attorney, Agent, or Firm* — Occhiuti & Rohlicek LLP

(57) ABSTRACT

Disclosed are methods, systems, devices, apparatus, media, and other implementations, including a method for digital predistortion for a power amplifier system. The method includes determining one or more system characteristics for the power amplifier system comprising at least a power amplifier that produces output with non-linear distortions, with the one or more system characteristics corresponding to an estimate for a complex load metric for the power amplifier system coupled to a load. The method further includes determining, based on the one or more system characteristics corresponding to the estimate for the complex load (Continued)

metric, digital predistortion (DPD) coefficients to compensate for the nonlinear behavior of the power amplifier system.

27 Claims, 6 Drawing Sheets

(51) Int. Cl.
  *H04B 1/04* (2006.01)
  *H04L 27/36* (2006.01)
(52) U.S. Cl.
  CPC ........... *H03F 3/245* (2013.01); *H04B 1/0475* (2013.01); *H04L 27/368* (2013.01); *H03F 2200/451* (2013.01); *H03F 2201/3233* (2013.01); *H04B 2001/0425* (2013.01)
(58) Field of Classification Search
  CPC ..... H03F 2201/3233; H03F 2201/0425; H04L 27/368; H04B 1/0475
  USPC ........................................................ 375/297
  See application file for complete search history.

(56) References Cited

U.S. PATENT DOCUMENTS

| | | |
|---|---|---|
| 5,980,457 A | 11/1999 | Averkiou |
| 6,052,412 A | 4/2000 | Ruether et al. |
| 6,240,278 B1 | 5/2001 | Midya et al. |
| 6,288,610 B1 | 9/2001 | Miyashita |
| 6,549,067 B1 | 4/2003 | Kenington |
| 7,142,615 B2 | 11/2006 | Hongo et al. |
| 7,170,344 B2 | 1/2007 | Suzuki et al. |
| 7,289,773 B2 | 10/2007 | Braithwaite |
| 7,295,815 B1 | 11/2007 | Wright et al. |
| 7,321,264 B2 | 1/2008 | Kokkeler |
| 7,333,557 B2 | 2/2008 | Rashev et al. |
| 7,469,491 B2 | 12/2008 | McCallister et al. |
| 7,529,652 B1 | 5/2009 | Gahinet et al. |
| 7,577,211 B2 | 8/2009 | Braithwaite |
| 7,599,431 B1 | 10/2009 | Anderson et al. |
| 7,634,238 B2 | 12/2009 | Suzuki et al. |
| 7,796,960 B1 | 9/2010 | Rashev et al. |
| 7,904,033 B1 | 3/2011 | Wright et al. |
| 8,121,560 B1 | 2/2012 | Anaraki et al. |
| 8,185,066 B2 | 5/2012 | Camp, Jr. et al. |
| 8,306,149 B2 | 11/2012 | Mujica et al. |
| 8,391,809 B1 | 3/2013 | Fuller |
| 8,411,730 B2 | 4/2013 | Maeda |
| 8,446,979 B1 | 5/2013 | Yee |
| 8,498,590 B1 | 7/2013 | Rashev et al. |
| 8,519,789 B2 | 8/2013 | Hawkes |
| 8,576,941 B2 | 11/2013 | Bai |
| 8,644,437 B2 | 2/2014 | Kim et al. |
| 8,666,336 B1 | 3/2014 | Dick |
| 8,711,976 B2 | 4/2014 | Chandrasekaran |
| 8,731,005 B2 | 5/2014 | Schlee |
| 8,731,105 B2 | 5/2014 | Bai |
| 8,890,609 B2 | 11/2014 | Laporte |
| 9,071,207 B2 | 6/2015 | Bai |
| 9,130,628 B1 | 9/2015 | Mittal et al. |
| 9,173,173 B2 | 10/2015 | Wei et al. |
| 9,184,710 B2 | 11/2015 | Braithwaite |
| 9,226,189 B1 | 12/2015 | Kularatna et al. |
| 9,252,712 B2 | 2/2016 | Li et al. |
| 9,331,882 B2 | 5/2016 | Fehri et al. |
| 9,337,782 B1 | 5/2016 | Mauer et al. |
| 9,564,876 B2 | 2/2017 | Kim et al. |
| 9,590,668 B1 * | 3/2017 | Kim ...................... H03F 1/3252 |
| 9,595,920 B2 | 3/2017 | Li et al. |
| 9,614,557 B1 | 4/2017 | Mayer et al. |
| 9,621,236 B2 | 4/2017 | Ghannouchi et al. |
| 9,628,119 B2 | 4/2017 | Gal et al. |
| 9,722,646 B1 | 8/2017 | Matthews et al. |
| 9,749,161 B1 | 8/2017 | Gal et al. |
| 9,831,899 B1 | 11/2017 | Boghrat et al. |
| 9,935,810 B1 | 4/2018 | Hammler et al. |
| 9,973,370 B1 | 5/2018 | Langer et al. |
| 10,033,413 B2 | 7/2018 | Pratt |
| 10,033,414 B2 | 7/2018 | Ota |
| 10,079,699 B1 | 9/2018 | Li et al. |
| 10,080,178 B2 | 9/2018 | Stapleton et al. |
| 10,141,896 B2 | 11/2018 | Huang |
| 10,141,961 B1 | 11/2018 | Huang et al. |
| 10,181,914 B2 | 1/2019 | Li et al. |
| 10,404,296 B2 | 9/2019 | Kim et al. |
| 10,447,511 B2 | 10/2019 | Xie et al. |
| 10,469,109 B2 | 11/2019 | Gutman et al. |
| 10,523,159 B2 | 12/2019 | Megretski et al. |
| 10,581,470 B2 | 3/2020 | Megretski et al. |
| 10,623,118 B2 | 4/2020 | Lagoy et al. |
| 10,644,657 B1 | 5/2020 | Megretski et al. |
| 10,763,904 B2 | 9/2020 | Megretski et al. |
| 10,812,166 B2 | 10/2020 | Kim et al. |
| 10,826,739 B1 | 11/2020 | Fomin et al. |
| 2001/0050592 A1 | 12/2001 | Wright et al. |
| 2002/0080891 A1 | 6/2002 | Ahn et al. |
| 2003/0058960 A1 | 3/2003 | Lee |
| 2003/0184374 A1 | 10/2003 | Huang et al. |
| 2003/0207680 A1 | 11/2003 | Yang et al. |
| 2004/0076247 A1 | 4/2004 | Barak et al. |
| 2004/0116083 A1 | 6/2004 | Suzuki et al. |
| 2004/0121741 A1 | 6/2004 | Rashev et al. |
| 2004/0142667 A1 | 7/2004 | Lochhead et al. |
| 2004/0196922 A1 | 10/2004 | Leffel |
| 2005/0001684 A1 | 1/2005 | Braithwaite |
| 2005/0163251 A1 | 7/2005 | McCallister |
| 2005/0163252 A1 | 7/2005 | McCallister et al. |
| 2005/0163268 A1 | 7/2005 | McCallister |
| 2005/0180527 A1 | 8/2005 | Suzuki et al. |
| 2005/0190857 A1 | 9/2005 | Braithwaite |
| 2006/0022751 A1 | 2/2006 | Fuller et al. |
| 2006/0154622 A1 | 7/2006 | Piirainen |
| 2006/0229036 A1 | 10/2006 | Muller et al. |
| 2006/0276147 A1 | 12/2006 | Suzuki |
| 2007/0091992 A1 | 4/2007 | Dowling |
| 2007/0230557 A1 | 10/2007 | Balasubramonian et al. |
| 2007/0241812 A1 | 10/2007 | Yang et al. |
| 2008/0003945 A1 | 1/2008 | Wenham |
| 2008/0019453 A1 | 1/2008 | Zhao et al. |
| 2008/0039045 A1 | 2/2008 | Filipovic et al. |
| 2008/0049868 A1 | 2/2008 | Brobston |
| 2008/0057882 A1 | 3/2008 | Singerl |
| 2008/0085684 A1 * | 4/2008 | Phillips ................. H03F 1/3282 455/114.3 |
| 2008/0101502 A1 | 5/2008 | Navidpour et al. |
| 2008/0247487 A1 | 10/2008 | Cai et al. |
| 2008/0260066 A1 | 10/2008 | Cai et al. |
| 2008/0268794 A1 | 10/2008 | Mege et al. |
| 2008/0268795 A1 | 10/2008 | Saed |
| 2008/0285640 A1 | 11/2008 | McCallister |
| 2009/0201084 A1 | 8/2009 | See et al. |
| 2010/0019983 A1 * | 1/2010 | Bonnet ..................... H01P 5/18 343/861 |
| 2010/0026354 A1 | 2/2010 | Utsunomiya et al. |
| 2010/0048149 A1 | 2/2010 | Tang et al. |
| 2010/0225390 A1 * | 9/2010 | Brown ..................... H03F 1/26 330/149 |
| 2010/0297966 A1 | 11/2010 | Row et al. |
| 2011/0044158 A1 | 2/2011 | Tao et al. |
| 2011/0085490 A1 | 4/2011 | Schlee |
| 2011/0098011 A1 | 4/2011 | Camp, Jr. et al. |
| 2011/0128992 A1 | 6/2011 | Maeda et al. |
| 2011/0135035 A1 | 6/2011 | Bose et al. |
| 2011/0150130 A1 | 6/2011 | Kenington |
| 2011/0156815 A1 * | 6/2011 | Kim ...................... H03F 1/3258 330/149 |
| 2011/0163806 A1 | 7/2011 | Hongo |
| 2011/0187437 A1 | 8/2011 | Perreault et al. |
| 2011/0235734 A1 | 9/2011 | Kenington |
| 2011/0255627 A1 | 10/2011 | Gotman et al. |
| 2011/0273234 A1 | 11/2011 | Van der Heijden et al. |
| 2011/0273236 A1 | 11/2011 | Heijden et al. |

(56) References Cited

U.S. PATENT DOCUMENTS

| | | |
|---|---|---|
| 2012/0093210 A1 | 4/2012 | Schmidt et al. |
| 2012/0108189 A1 | 5/2012 | McCallister et al. |
| 2012/0119810 A1 | 5/2012 | Bai |
| 2012/0119811 A1 | 5/2012 | Bai et al. |
| 2012/0119831 A1 | 5/2012 | Bai |
| 2012/0147993 A1 | 6/2012 | Kim et al. |
| 2012/0154033 A1 | 6/2012 | Lozhkin |
| 2012/0154430 A1 | 6/2012 | Matsushima et al. |
| 2012/0176195 A1 | 7/2012 | Dawson et al. |
| 2012/0194271 A1 | 8/2012 | Yamamoto et al. |
| 2012/0199810 A1 | 8/2012 | Lee |
| 2012/0200355 A1 | 8/2012 | Braithwaite |
| 2012/0219048 A1* | 8/2012 | Camuffo .................. H03F 3/72 375/224 |
| 2012/0286865 A1 | 11/2012 | Chandrasekaran |
| 2012/0286985 A1 | 11/2012 | Chandrasekaran et al. |
| 2012/0293252 A1 | 11/2012 | Sorrells et al. |
| 2012/0295558 A1 | 11/2012 | Wang et al. |
| 2013/0033317 A1 | 2/2013 | Hawkes |
| 2013/0034188 A1 | 2/2013 | Rashev et al. |
| 2013/0044791 A1 | 2/2013 | Rimini et al. |
| 2013/0064325 A1 | 3/2013 | Kilambi et al. |
| 2013/0094610 A1 | 4/2013 | Ghannouchi et al. |
| 2013/0094612 A1 | 4/2013 | Kim et al. |
| 2013/0163512 A1 | 6/2013 | Rexberg et al. |
| 2013/0243121 A1 | 9/2013 | Bai |
| 2013/0251065 A1 | 9/2013 | Bai |
| 2013/0259159 A1 | 10/2013 | McCallister et al. |
| 2013/0329833 A1 | 12/2013 | Bai |
| 2014/0009225 A1 | 1/2014 | Laporte |
| 2014/0016725 A1 | 1/2014 | Peroulas et al. |
| 2014/0038659 A1 | 2/2014 | Wei et al. |
| 2014/0139286 A1 | 5/2014 | Laporte |
| 2014/0161159 A1 | 6/2014 | Black et al. |
| 2014/0161207 A1 | 6/2014 | Teterwak |
| 2014/0177695 A1 | 6/2014 | Cha et al. |
| 2014/0187182 A1 | 7/2014 | Yan et al. |
| 2014/0254716 A1 | 9/2014 | Zhou et al. |
| 2014/0274105 A1 | 9/2014 | Wang |
| 2014/0292579 A1 | 10/2014 | Oh et al. |
| 2014/0347126 A1 | 11/2014 | Laporte et al. |
| 2015/0043313 A1 | 2/2015 | Stranczl et al. |
| 2015/0043323 A1 | 2/2015 | Choi et al. |
| 2015/0043678 A1 | 2/2015 | Hammi |
| 2015/0049841 A1 | 2/2015 | Laporte et al. |
| 2015/0061761 A1 | 3/2015 | Wills et al. |
| 2015/0103952 A1 | 4/2015 | Wang et al. |
| 2015/0123735 A1 | 5/2015 | Wimpenny |
| 2015/0124907 A1 | 5/2015 | Li et al. |
| 2015/0171768 A1 | 6/2015 | Perreault |
| 2015/0325913 A1 | 11/2015 | Vagman |
| 2015/0326349 A1 | 11/2015 | Yang et al. |
| 2015/0333711 A1* | 11/2015 | Langer .................. H03F 3/21 455/127.2 |
| 2015/0333781 A1 | 11/2015 | Alon et al. |
| 2015/0357975 A1 | 12/2015 | Avniel et al. |
| 2015/0358039 A1 | 12/2015 | Xiong et al. |
| 2015/0372745 A1 | 12/2015 | Abe |
| 2015/0381216 A1 | 12/2015 | Shor et al. |
| 2015/0381220 A1 | 12/2015 | Gal et al. |
| 2016/0013820 A1 | 1/2016 | Yamanouchi |
| 2016/0028433 A1 | 1/2016 | Ding et al. |
| 2016/0034421 A1 | 2/2016 | Magesacher et al. |
| 2016/0043753 A1 | 2/2016 | Jungnickel et al. |
| 2016/0065147 A1 | 3/2016 | Pratt et al. |
| 2016/0087604 A1 | 3/2016 | Kim et al. |
| 2016/0094253 A1 | 3/2016 | Weber et al. |
| 2016/0095110 A1 | 3/2016 | Li et al. |
| 2016/0100180 A1 | 4/2016 | Oh |
| 2016/0112222 A1 | 4/2016 | Pashay-Kojouri et al. |
| 2016/0174118 A1 | 6/2016 | Duan et al. |
| 2016/0191020 A1 | 6/2016 | Velazquez |
| 2016/0211577 A1 | 7/2016 | Miller et al. |
| 2016/0218891 A1 | 7/2016 | Nammi et al. |
| 2016/0241277 A1 | 8/2016 | Rexberg et al. |
| 2016/0249300 A1 | 8/2016 | Tsai et al. |
| 2016/0285485 A1 | 9/2016 | Fehri et al. |
| 2016/0308577 A1 | 10/2016 | Molina et al. |
| 2016/0336906 A1 | 11/2016 | Lee et al. |
| 2016/0373072 A1 | 12/2016 | Magesacher et al. |
| 2017/0005627 A1 | 1/2017 | Zhao et al. |
| 2017/0033969 A1 | 2/2017 | Yang et al. |
| 2017/0041124 A1 | 2/2017 | Khandani |
| 2017/0047899 A1 | 2/2017 | Abdelrahman et al. |
| 2017/0077981 A1 | 3/2017 | Tobisu et al. |
| 2017/0176507 A1 | 6/2017 | O'Keeffe et al. |
| 2017/0201275 A1 | 7/2017 | Tabatabai et al. |
| 2017/0214438 A1 | 7/2017 | Ghannouchi et al. |
| 2017/0237455 A1 | 8/2017 | Ye et al. |
| 2017/0244582 A1 | 8/2017 | Gal et al. |
| 2017/0302233 A1 | 10/2017 | Huang |
| 2017/0338841 A1 | 11/2017 | Pratt |
| 2018/0097530 A1 | 4/2018 | Yang et al. |
| 2018/0159568 A1 | 6/2018 | Matsuura et al. |
| 2018/0167092 A1 | 6/2018 | Hausmair et al. |
| 2018/0191537 A1 | 7/2018 | Xiong et al. |
| 2018/0287569 A1 | 10/2018 | Xu et al. |
| 2018/0337700 A1 | 11/2018 | Huang et al. |
| 2019/0007075 A1 | 1/2019 | Kim et al. |
| 2019/0097662 A1 | 3/2019 | Hornbuckle et al. |
| 2019/0104000 A1 | 4/2019 | Xie et al. |
| 2019/0238204 A1 | 8/2019 | Kim et al. |
| 2019/0260401 A1 | 8/2019 | Megretski et al. |
| 2019/0260402 A1 | 8/2019 | Chuang et al. |
| 2019/0348956 A1 | 11/2019 | Megretski et al. |
| 2019/0363676 A1 | 11/2019 | Megretski et al. |
| 2019/0363742 A1 | 11/2019 | Megretski et al. |
| 2020/0028476 A1 | 1/2020 | Kim et al. |
| 2020/0067543 A1 | 2/2020 | Kim et al. |
| 2020/0119755 A1 | 4/2020 | Mahmood et al. |

FOREIGN PATENT DOCUMENTS

| | | |
|---|---|---|
| CN | 101971507 A | 2/2011 |
| CN | 103201949 A | 7/2013 |
| CN | 104796170 A | 7/2015 |
| CN | 104871433 A | 8/2015 |
| CN | 105634539 A | 6/2016 |
| CN | 106464280 A | 2/2017 |
| EP | 0916967 A2 | 5/1999 |
| EP | 1560329 A1 | 8/2005 |
| EP | 1732208 A1 | 12/2006 |
| EP | 2991221 A1 | 3/2016 |
| JP | 2005-065211 A | 3/2005 |
| JP | 2010-136123 A | 6/2010 |
| JP | 4813995 B2 * | 11/2011 |
| JP | 2013-542696 A | 11/2013 |
| JP | 2014-533017 A | 12/2014 |
| KR | 20100040497 A | 4/2010 |
| WO | 20120154430 A1 | 11/2012 |
| WO | 2015107392 A1 | 7/2015 |
| WO | 2018156932 A1 | 8/2018 |
| WO | 2018227093 A1 | 12/2018 |
| WO | 2018227111 A1 | 12/2018 |
| WO | 2019/014422 A1 | 1/2019 |
| WO | 2019031714 A1 | 2/2019 |
| WO | 2019070573 A1 | 4/2019 |
| WO | 2019094713 A1 | 5/2019 |
| WO | 2019094720 A1 | 5/2019 |

OTHER PUBLICATIONS

Cheng, Sheng-Lung, Wen-Rong Wu, Chun-Hsien Peng, Chen-Jui Hsu, and Paul Liang. "Digital predistortion for concurrent dual-band transmitter using a 2D LUT based method." In 2015 IEEE 16th Annual Wireless and Microwave Technology Conference (WAMICON), pp. 1-4. IEEE, 2015.

R.N. Braithwaite, "Implementing crest factor reduction (CFR) by offsetting digital predistortion (DPD) coefficients," 2012 Workshop on Integrated Nonlinear Microwave and Millimetre-wave Circuits, Dublin, 2012, pp. 1-3, doi: 10.1109/NMMIC.2012.6331928. (Year: 2012).

(56) References Cited

OTHER PUBLICATIONS

Aguirre, et al., "On the Interpretation and Practice of Dynamical Differences Between Hammerstein and Wiener Models", IEEE Proceedings on Control TheoryAppl; vol. 152, No. 4, Jul. 2005, pp. 349-356.

Barradas, et al. "Polynomials and LUTs in PA Behavioral Modeling: A Fair Theoretical Comparison", IEEE Transactions on Microwave Theory and Techniques; vol. 62, No. 12, Dec. 2014, pp. 3274-3285.

Bosch et al. "Measurement and Simulation of Memory Effects in Predistortion Linearizers," IEEE Transactions on Mircrowave Theory and Techniques; vol. 37.No. 12; Dec. 1989, pp. 1885-1890.

Braithwaite, et al. "Closed-Loop Digital Predistortion (DPD) Using an Observation Path with Limited Bandwidth" IEEE Transactions on Microwave Theory and Techniques; vol. 63, No. 2; Feb. 2015, pp. 726-736.

Cavers, "Amplifier Linearization Using a Digital Predistorter with Fast Adaption and Low Memory Requirements;" IEEE Transactions on Vehicular Technology; vol. 39; No. 4; Nov. 1990, pp. 374-382.

D'Andrea et al., "Nonlinear Predistortion of OFDM Signals over Frequency-Selective Fading Channels," IEEE Transactions on Communications; vol. 49; No. 5, May 2001; pp. 837-843.

Guan, et al. "Optimized Low-Complexity Implementation of Least Squares Based Model Extraction of Digital Predistortion of RF Power Amplifiers", IEEE Transactions on Microwave Theory and Techniques; vol. 60, No. 3, Mar. 2012; pp. 594-603.

Henrie, et al., "Cancellation of Passive Intermodulation Distortion in Microwave Networks", Proceedings of the 38.sup.th European Microwave Conference, Oct. 2008, Amsterdam, The Netherlands, pp. 1153-1156.

Hong et al., "Weighted Polynomial Digital Predistortion for Low Memory Effect Doherty Power Amplifier," IEEE Transactions on Microwave Theory and Techniques; vol. 55; No. 5, May 2007, pp. 925-931.

Kwan, et al., "Concurrent Multi-Band Envelope Modulated Power Amplifier Linearized Using Extended Phase-Aligned DPD", IEEE Transactions on Microwave Theory and Techniques; vol. 62, No. 12, Dec. 2014, pp. 3298-3308.

Lajoinie et al. Efficient Simulation of NPR for the Optimum Design of Satellite Transponders SSPAs, EEE MTT-S International; vol. 2; Jun. 1998; pp. 741-744.

Li et al. "High-Throughput Signal Component Separator for Asymmetric Multi-Level Outphasing Power Amplifiers," IEEE Journal of Solid-State Circuits; vol. 48; No. 2; Feb. 2013; pp. 369-380.

Liang, et al. "A Quadratic-Interpolated Lut-Based Digital Predistortion Techniques for Cellular Power Amplifiers", IEEE Transactions on Circuits and Systems; II: Express Briefs, vol. 61, No. 3, Mar. 2014; pp. 133-137.

Liu, et al. "Digital Predistortion for Concurrent Dual-Band Transmitters Using 2-D Modified Memory Polynomials", IEEE Transactions on Microwave Theory and Techniques, vol. 61, No. 1, Jan. 2013, pp. 281-290.

Molina, et al. "Digital Predistortion Using Lookup Tables with Linear Interpolation and Extrapolation: Direct Least Squares Coefficient Adaptation", IEEE Transactions on Microwave Theory and Techniques, vol. 65, No. 3, Mar. 2017; pp. 980-987.

Morgan, et al. "A Generalized Memory Polynomial Model for Digital Predistortion of RF Power Amplifiers," IEEE Transactions of Signal Processing; vol. 54; No. 10; Oct. 2006; pp. 3852-3860.

Muta et al., "Adaptive predistortion linearization based on orthogonal polynomial expansion for nonlinear power amplifiers in OFDM systems", Communications and Signal Processing (ICCP), International Conference on, IEEE, pp. 512-516, 2011.

Naraharisetti, et a., "2D Cubic Spline Implementation for Concurrent Dual-Band System", IEEE, 2013, pp. 1-4.

Naraharisetti, et al. "Efficient Least-Squares 2-D-Cubic Spline for Concurrent Dual-Band Systems", IEEE Transactions an Microwave Theory and Techniques, vol. 63; No. 7, Jul. 2015; pp. 2199-2210.

Panigada, et al. "A 130 mW 100 MS/s Pipelined ADC with 69 SNDR Enabled by Digital Harmonic Distortion Correction," IEEE Journal of Solid-State Circuits; vol. 44; No. 12; Dec. 2009, pp. 3314-3328.

Peng, et al. "Digital Predistortion for Power Amplifier Based on Sparse Bayesian Learning", IEEE Transactions on Circuits and Systems, II: Express Briefs; 2015, pp. 1-5.

Quindroit et al. "FPGA Implementation of Orthogonal 2D Digital Predistortion System for Concurrent Dual-Band Power Amplifiers Based on Time-Division Multiplexing", IEEE Transactions on Microwave Theory and Techniques; vol. 61 No. 12, Dec. 2013, pp. 4591-4599.

Rawat, et al. "Adaptive Digital Predistortion of Wireless Power Amplifiers/Transmitters Using Dynamic Real-Valued Focused Time-Delay Line Neural Networks", IEEE Transactions on Microwave Theory and Techniques; vol. 58, No. 1; Jan. 1, 2010; pp. 95-104.

Safari, et al. "Spline-Based Model for Digital Predistortion of Wide-Band Signals for High Power Amplifier Linearization", IEEE; 2007, pp. 1441-1444.

Sevic, et al. "A Novel Envelope-Termination Load-Pull Method of ACPR Optimization of RF/Microwave Power Amplifiers," IEEE MTT-S International; vol. 2, Jun. 1998; pp. 723-726.

Tai, "Efficient Watt-Level Power Amplifiers in Deeply Scaled CMOS," Ph D. Dissertation; Carnegie Mellon University May 2011; 129 pages.

Tehran, et al. "Modeling of Long Term Memory Effects in RF Power Amplifiers with Dynamic Parameters", IEEE; 2012, pp. 1-3.

Yu et al. "A Generalized Model Based on Canonical Piecewise Linear Functions for Digital Predistortion", Proceedings of the Asia-Pacific Microwave Conference; 2016, pp. 1-4.

Yu, et al. "Band-Limited Volterra Series-Based Digital Predistortion for Wideband RF Power Amplifiers," IEEE Transactions of Microwave Theory and Techniques; vol. 60; No. 12; Dec. 2012, pp. 4198-4208.

Yu, et al."Digital Predistortion Using Adaptive Basis Functions", IEEE Transations on Circuits and Systems—I. Regular Papers; vol. 60, No. 12; Dec. 2013, pp. 3317-3327.

Zhang et al. "Linearity Performance of Outphasing Power Amplifier Systems," Design of Linear Outphasing Power Amplifiers; Google e-book; 2003; Retrieved on Jun. 13, 2014; Retrieved from Internet <URL:http:www.artechhouse.com/uploads/public/documents/chapters/Zhang-LarsonCH- 2.pdf; pp. 35-85.

Zhu et al. "Digital Predistortion for Envelope-Tracking Power Amplifiers Using Decomposed Piecewise Volterra Sereis," IEEE Transactions on Microwave Theory and Techniques; vol. 56; No. 10; Oct. 2008; pp. 2237-2247.

Cidronali, A., I. Magrini, R. Fagotti, and G. Manes. "A new approach for concurrent dual-band IF digital predistortion: System design and analysis." In 2008 Workshop on Integrated Nonlinear Microwave and Millimetre-Wave Circuits, pp. 127-130. IEEE, 2008.

Henrie, Justin, Andrew Christianson, and William J. Chappell. "Cancellation of passive intermodulation distortion in microwave networks." In Microwave Conference, 2008. EuMC 2008. 38th European, pp. 1153-1156. IEEE, 2008.

Riihonen et al., "Mitigation of Loopback Self-Interference in Full-Duplex Mimo Relays" IEEE Transactions on Signal Processing, 59(12), 5983-5993, Dec. 2011.

International Search Report dated Dec. 13, 2018 in International Application No. PCT/2018/053739.

* cited by examiner

DIGITAL PREDISTORTION ADJUSTMENT BASED ON DETERMINATION OF LOAD CONDITION CHARACTERISTICS

CROSS-REFERENCE TO RELATED APPLICATIONS

This application is the national phase under 35 USC 371 of international application no. PCT/US2018/053739, filed Oct. 1, 2018, which claims the benefit of U.S. Provisional Application No. 62/566,946, filed Oct. 2, 2017, the contents of which are incorporated by reference.

BACKGROUND

The present disclosure relates to digital predistortion adjustment.

Power amplifiers, especially those used to transmit radio frequency communications, generally have nonlinear characteristics. For example, as a power amplifier's output power approaches its maximum rated output, nonlinear distortion of the output occurs. One way of compensating for the nonlinear characteristics of power amplifiers is to 'predistort' an input signal (e.g., by adding an 'inverse distortion' to the input signal) to negate the nonlinearity of the power amplifier before providing the input signal to the power amplifier. The resulting output of the power amplifier is a linear amplification of the input signal with reduced nonlinear distortion. Digital predistorting power amplifiers are relatively inexpensive and power efficient. These properties make digital predistorting power amplifiers attractive for use in telecommunication systems where amplifiers are required to inexpensively, efficiently, and accurately reproduce the signal present at their input.

Power amplifiers' behavior is sensitive to varying load conditions as represented by a metric such as: a) the complex voltage standing wave ratio (VSWR), b) the complex load impedance, and/or c) the complex reflection coefficient. Changes of the load metric values (e.g., VSWR) in dynamic environments cause degradation in performance of a digital predistortion (DPD) system (in terms of metrics such as ACLR, EVM, power efficiency, etc.)

SUMMARY

In a general aspect, an approach to measure or infer the complex load metric (such as VSWR), based on bias current and input and output power of the power amplifier, is provided. This complex load metric is used to determine appropriate DPD coefficients. Some of the approaches described herein thus provide a practical and compact solution in that load conditions (and thus changes to DPD coefficients used) may be based on data measurable or determinable at the power amplification system, without requiring measurement based on the load behavior (e.g., without RF feedback from the load). The proposed solutions are simple enough that it can be implemented, for example, at a handset device (e.g., at a smartphone, a tablet device, or any other mobile device), or at a network node (e.g., base station or access point). Some examples of the solutions described herein allow for changing load conditions to be tracked in a simple and easy-to-implement manner, in order to maintain linearized performance.

In some variations, a method for digital predistortion is provided that includes determining one or more system characteristics for a power amplification system comprising at least a power amplifier that produces output with non-linear distortions, with the one or more system characteristics corresponding to an estimate for a complex load metric for the power amplification system coupled to a load. The method further includes determining, based on the one or more system characteristics corresponding to the estimate for the complex load metric, digital predistortion (DPD) coefficients to control operation of the power amplification system (e.g., to compensate for non-linear behavior of the power amplifier system).

Embodiments of the method may include at least some of the features described in the present disclosure, including one or more of the following features.

The load metric may include a complex voltage standing wave ratio (VSWR) metric associated with load conditions for the power amplification system resulting from the load.

The load metric comprising the complex VSWR metric may include a phase component and an amplitude component.

Determining the one or more system characteristics may include determining input power, $P_{IN}$, of an input signal provided to the power amplification system, an output power, $P_{OUT}$, of an output of the power amplification system resulting from amplification operations performed on the input signal, and a bias current, $I_{PA}$, provided to the power amplification system.

Determining the one or more system characteristics may further include determining a parameter representative of power added efficiency based on a relationship of $P_{IN}$, $P_{OUT}$, and $I_{PA}$.

The method may further include deriving, based on the one or more system characteristics, the estimate for the complex load metric for the power amplification system coupled to the load.

Deriving the estimate for the complex load metric may include deriving the estimate for the complex load metric as a function of $P_{IN}$, $P_{OUT}$, and $I_{PA}$.

Deriving the estimate for the complex load metric as a function of $P_{IN}$, $P_{OUT}$, and $I_{PA}$ may include mapping $P_{IN}$, $P_{OUT}$, and $I_{PA}$ to one or more of a plurality of pre-determined complex load metric values.

Determining, based on the one or more system characteristics corresponding to the estimate for the complex load metric, the DPD coefficients to control the operation of the power amplification system may include selecting, from a plurality of sets of DPD coefficients, a DPD coefficient set associated with a pre-determined complex load metric value that most closely matches the estimate for the load metric.

Determining, based on the one or more system characteristics corresponding to the estimate for the complex load metric, the DPD coefficients to control the operation of the power amplification system may include selecting from a plurality of sets of DPD coefficients, based on the one or more system characteristics corresponding to the estimate for the complex load metric, two or more sets of DPD coefficients, and determining an interpolated set of DPD coefficients from the selected two or more sets of DPD coefficients for use with the power amplification system.

Determining the plurality of system characteristics for the power amplification system may include determining the one or more system characteristics for the power amplification system without RF feedback from the load.

The method may further include processing an input signal to the power amplification system to produce a compensated signal according to the DPD coefficients, including applying a set of basis functions to the input signal to produce respective signal components corresponding to the set of basis functions, applying the DPD coefficients to the respective signal components of the set of basis functions to produce resultant predistorted signal components, and combining the resultant predistorted signal components to produce a predisorted signal provided to a transmit chain of the power amplification system.

Applying the set of basis functions to the input signals may include performing one or more non-linear transformations of the input signal to produce the respective signal components.

Performing the non-linear transformation may include performing the non-linear transformations according to respective polynomial functions, including accepting an input u and producing an output of the form $|u|^k$ or $u|u|^k$ for a positive integer k.

In some variations, a power amplifier system is provided that includes at least one power amplifier that produces output with non-linear distortions, and a controller coupled to the at least one power amplifier. The controller is configured to determine one or more system characteristics for the power amplification system, with the one or more system characteristics corresponding to an estimate for a complex load metric for the power amplification system coupled to a load, and determine, based on the one or more system characteristics corresponding to the estimate for the complex load metric, digital predistortion (DPD) coefficients to control operation of the power amplification system.

Embodiments of the system may include at least some of the features described in the present disclosure, including at least some of the features described above in relation to the method, as well as one or more of the following features.

The controller configured to determine the one or more system characteristics may be configured to determine input power, $P_{IN}$, of an input signal provided to the at least one power amplifier, an output power, $P_{OUT}$, of an output of the at least one power amplifier resulting from amplification operations performed on the input signal, and a bias current, $I_{PA}$, provided to the at least one power amplifier, and to determine a parameter representative of power added efficiency based on a relationship of $P_{IN}$, $P_{OUT}$, and $I_{PA}$.

The power amplifier system may further include a power detector coupled to the output of the at least one power amplifier, with the power detector configured to measure the output power, $P_{OUT}$, of the at least one power amplifier.

The controller may further be configured to derive the estimate for the complex load metric as a function of $P_{IN}$, $P_{OUT}$, and $I_{PA}$.

The controller configured to derive the estimate for the complex load metric may be configured to map $P_{IN}$, $P_{OUT}$, and $I_{PA}$ to one or more of a plurality of pre-determined complex load metric values.

The controller configured to determine, based on the one or more system characteristics corresponding to the estimate for the complex load metric, the DPD coefficients to control the operation of the power amplification system may be configured to select, from a plurality of sets of DPD coefficients, a DPD coefficient set associated with a pre-determined complex load metric value that most closely matches the estimate for the load metric.

The controller configured to determine, based on the one or more system characteristics corresponding to the estimate for the complex load metric, the DPD coefficients to control the operation of the power amplification system may be configured to select from a plurality of sets of DPD coefficients, based on the one or more system characteristics corresponding to the estimate for the complex load metric, two or more sets of DPD coefficients, and determine an interpolated set of DPD coefficients from the selected two or more sets of DPD coefficients for use with the power amplification system.

The controller may further include a digital predistorter configured to process an input signal to the power amplification system to produce a compensated signal according to the DPD coefficients, including to apply a set of basis functions to the input signal to produce respective signal components corresponding to the set of basis functions, to apply the DPD coefficients to the respective signal components of the set of basis functions to produce resultant predistorted signal components, and to combine the resultant predistorted signal components to produce a predisorted signal provided to a transmit chain of the power amplification system.

In some variations, a power amplifier system is provided that is configured to perform one or more of the method steps provided above.

In some variations, a design structure is provided that is encoded on a non-transitory machine-readable medium, with the design structure including elements that, when processed in a computer-aided design system, generate a machine-executable representation of one or more of the power amplifier system modules and components described above.

In some variations, an integrated circuit definition dataset that, when processed in an integrated circuit manufacturing system, configures the integrated circuit manufacturing system to manufacture one or more of the power amplifier system modules described above.

In some variations, a non-transitory computer readable media is provided that is programmed with a set of computer instructions executable on a processor that, when executed, cause the operations comprising the various method steps described above.

Embodiments of the power amplifier system, the design structure, the integrated circuit definition dataset, and the computer-readable media may include at least some of the features described in the present disclosure, including at least some of the features described above in relation to the method and the first power amplifier system.

Other features and advantages of the invention are apparent from the following description, and from the claims.

BRIEF DESCRIPTION OF THE DRAWINGS

These and other aspects will now be described in detail with reference to the following drawings.

Like reference symbols in the various drawings indicate like elements.

DESCRIPTION

Figure 1:
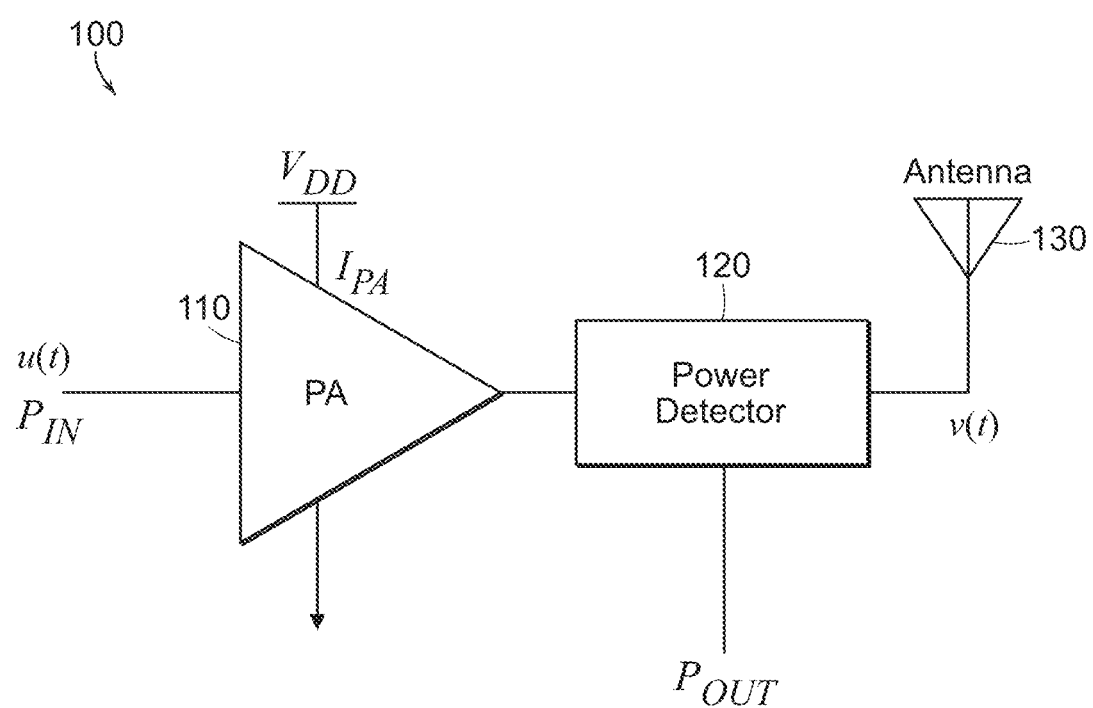
FIG. 1 is a circuit diagram of a part of an adjustable digital predistorting power amplifier system.

Disclosed herein are methods, systems, apparatus, devices, circuits, media, and other implementations, including a method for digital predistortion (to control a power amplification) system that includes determining one or more system characteristics for the power amplifier system, with the one or more system characteristics corresponding to an estimate for a complex load metric for the power amplification system. The method further includes determining, based on the one or more system characteristics corresponding to the estimate for the load metric, digital predistortion (DPD) coefficients to control operation of the power amplifier system (e.g., to compensate for the nonlinear behavior of the power amplifier system). In some embodiments, determining the DPD coefficients may include selecting, from a plurality of sets of DPD coefficients, a DPD coefficient set associated with a pre-determined load metric value that most closely matches the estimate for the complex load metric. Alternatively or additionally, determining the DPD coefficients may include selecting from a plurality of sets of DPD coefficients, based on the estimate for the complex load metric, two or more sets of DPD coefficients, and determining an interpolated set of DPD coefficients from the selected two or more sets of DPD coefficients for use with the power amplification system.

In some embodiments, the load metric may include a complex voltage standing wave ratio (VSWR) metric associated with load conditions for the power amplification system. VSWR is a complex quantity that is defined by an amplitude component and a phase component (alternatively, the complex quantity of the VSWR represents a real part and an imaginary part that are associated with the amplitude and phase, although they might not necessary be equal to those components) and may be represented graphically, for example, on a Smith Chart. As noted, variations to the load metric, e.g., resulting from changes to the load itself, changes to the environment in which the load and/or a device's transmitter are situated, changes to the transmitter (for example, the orientation of the transmitter to the load), and so on, can result in changes to the load conditions and thus to the needed digital predistortion behavior. Accordingly, in some of the embodiments described herein, determination of loading conditions/behavior, and dynamic changes to such loading conditions, can be used to dynamically adjust DPD for a power amplifier system, by for example, selecting one of a plurality of pre-determined DPD coefficient sets, deriving an interpolated coefficient set from one or more pre-determined DPD coefficient sets, etc.

One approach to compute loading condition (e.g., the VSWR, or some other representative value thereof) is by measuring, e.g., using a network analyzer implementation, an amplitude component of VSWR (for example, according to the relationship $$|VSWR| = \frac{1 + \sqrt{\frac{P_r}{P_f}}}{1 - \sqrt{\frac{P_r}{P_f}}},$$

where $P_r$ is the reflected wave power, and $P_f$ is the forward wave power). Thus, the above approach to determine the load metric VSWR does not take into account the phase information for the load condition, which often is more impactful to the adjustment of the DPD behavior than the magnitude information for the load conditions behavior. For example, knowledge of which quadrant (e.g., in a graphical representation of the load behavior, such as on a Smith chart) may aide the selection of a more optimal DPD set of coefficients from different coefficient sets corresponding to each of the different quadrants.

Therefore, in some embodiments, instead of determining the VSWR through direct measurements (which may be cumbersome and/or incomplete if the available apparatus can only be used to determine the magnitude component for the load metric), some of the implementations described herein determine local system characteristics, such as the input signal power, the output signal power (e.g., at the output of the transmit chain of the amplifier system), the bias current, etc., and use those locally determined system characteristics to determine DPD coefficients to update/adjust the amplifier system's digital predistortion behavior. Accordingly, the locally determined characteristics of the power amplifier system are effectively used to infer the load metric values (and, more particularly, to infer at least the phase component of the load metric) corresponding to the current load coupled to the power amplifier system. The determination of the local characteristics of the power amplifier system, in order to infer at least the phase component (and, in some embodiments, also the magnitude component) of the load metric generally does not require RF feedback information from the load, and therefore does not require any sophisticated instrumentations to be used at the device incorporating the power amplifier system.

Figure 6:
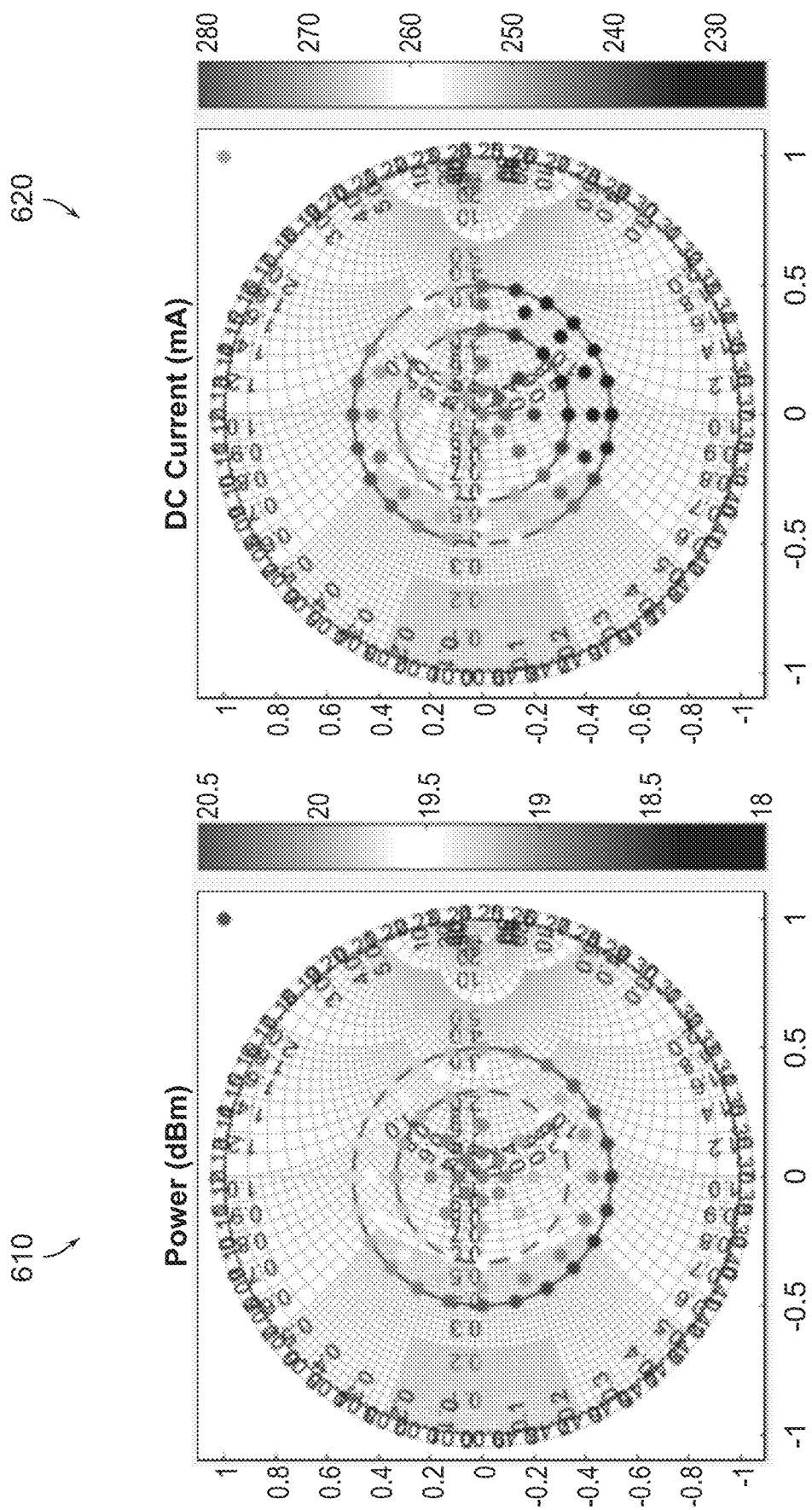
FIG. 6 includes graphs (of Smith charts) showing variations of the signal output power, $P_{OUT}$, and of the bias current, $I_{PA}$, for different VSWR metric values.

Thus, with reference to FIG. 1, a circuit diagram is shown of a part of a power amplifier system 100 coupled to a digital predistorter (not shown in FIG. 1). The power amplifier system 100 includes a power amplifier 110 that receives an input signal u(t) with an input power $P_{IN}$, and a bias current (also referred to as a PA current), $I_{PA}$ (or a quantity using the relationship of these parameters, such as power added efficiency). The power amplifier 110 may be a component in a transmit chain of the power amplifier system, as more particularly described below with respect to FIG. 2, to which a digital predistorter (DPD) unit is coupled (e.g., at the input the transmit chain). As further illustrated in FIG. 1, a power detector 120, coupled to the output of the power amplifier 110, determines the output power, $P_{OUT}$, of the amplified output signal of the power amplifier 110. The amplifier's output signal, v(t), is transmitted via an antenna element 130 to a remote load. As discussed herein, the values of $P_{IN}$, $I_{PA}$, $P_{OUT}$ can be used to infer, or otherwise be associated with, an estimate of the load metric. For example, for a particular first load condition, a given input signal, and a given source voltage $V_{DD}$, a corresponding first output power $P_{OUT1}$ and a first bias current $I_{PA1}$ will result. For the same input signal and $V_{DD}$, a second load condition, different from the first load condition, will result in a corresponding second output power $P_{OUT2}$ and a second bias current $I_{PA2}$. Thus, the combination of $P_{IN}$, $I_{PA}$, $P_{OUT}$ reflects or indicates the load conditions impacting the power amplifier system 100. Put another way, the combination of system characteristics can be used as a proxy for (or, alternatively, to infer) the respective load metric. FIG. 6 includes graphs (of Smith charts) showing, at a graph 610, variations of the signal output power, $P_{OUT}$ for different VSWR metric values, and showing, at a graph 620, variations of the bias current, $I_{PA}$, for different VSWR metric values. In some embodiments, other system characteristics (e.g., gain value) may be used in addition to, or instead of, one or more of the above-identified system characteristics for the power amplification system, to infer or act as a proxy for, the load metric.

Figure 2:
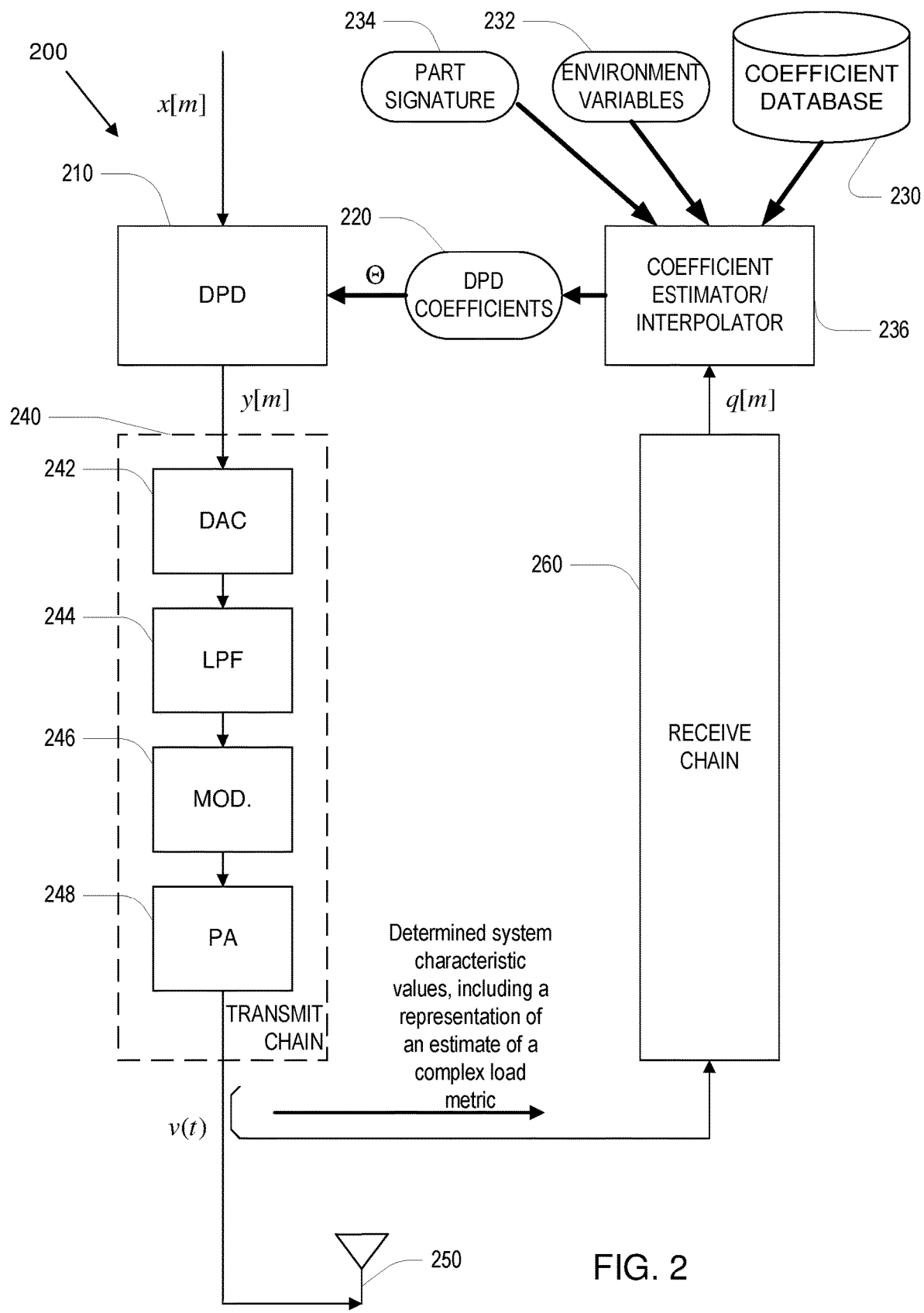
FIG. 2 is a block diagram of a linearization system.

With reference to FIG. 2, a block diagram of a linearization system 200 (also referred to as an adjustable predistortion power amplifier system, since the digital predistortion behavior can be adjusted based, for example, on load conditions), which may be similar to, or include, the system 100 of FIG. 1, is shown. In the example system 200, a digital input signal x[m] at a baseband or intermediate frequency is passed through a digital predistorter (DPD) 210 to produce a "pre-distorted" input y[m], which is passed through a transmit chain 240 to produce a driving signal v(t) (which may correspond to the signal v(t) of FIG. 1) that drives an antenna 250. The transmit chain may include a Digital-to-Analog Converter (DAC) 242, an analog lowpass filter (LPF) 244, and a modulator 246 (e.g., multiplication by a local oscillator) of the output of the LPF 244. The output of the modulator is passed to a power amplifier (PA) 248, which may be similar to (in configuration and/or functionality) to the power amplifier 110 of FIG. 1. The PA 248, as well as other elements in the transmit chain, may introduce non-linearities, which may be manifested in the driving signal v(t) as harmonic and/or intermodulation distortion of the input signal x[m].

Figure 3:
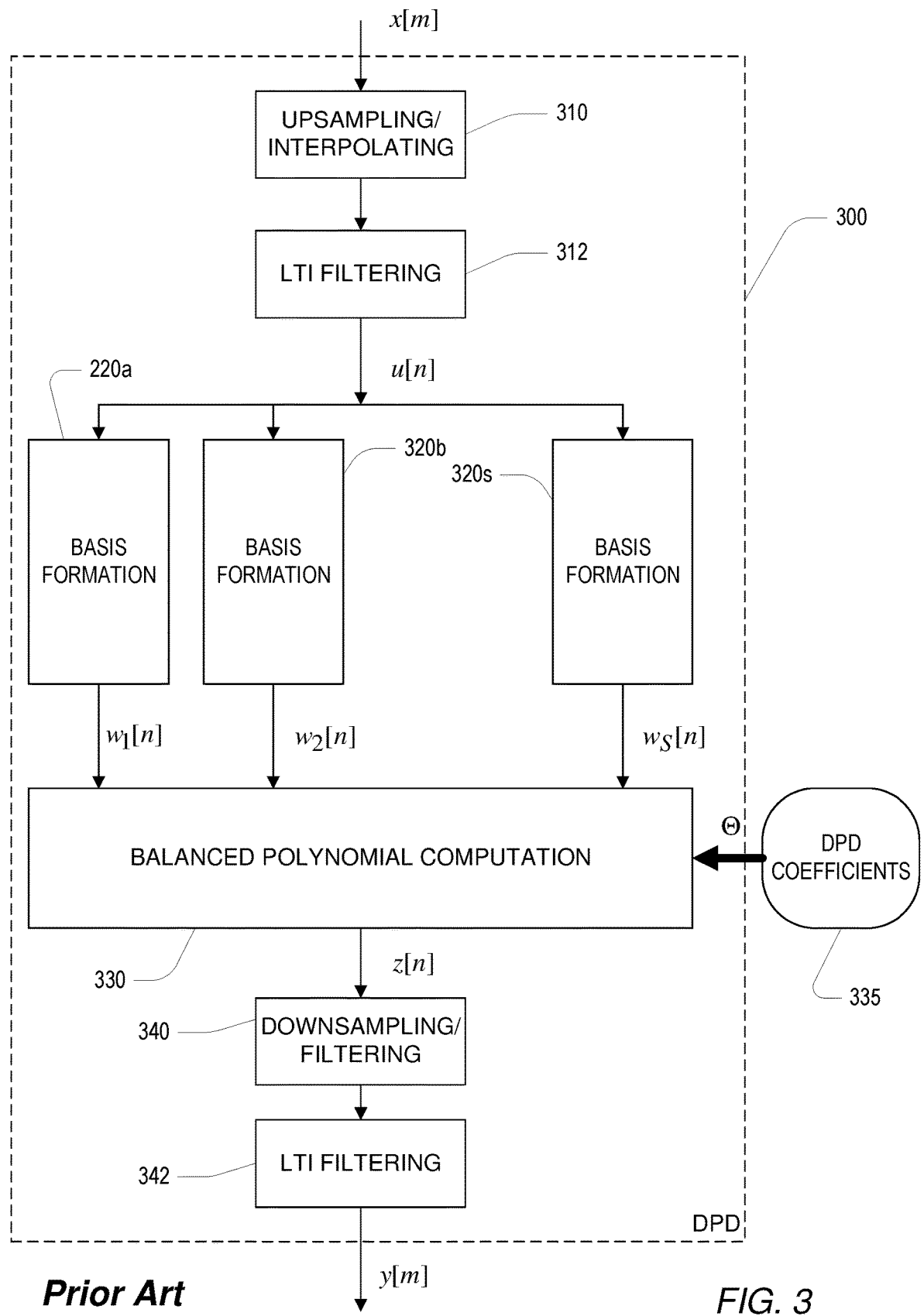
FIG. 3 is a block diagram of a digital predistorter (DPD), which may be used with the systems of FIGS. 1 and 2.

Referring to FIG. 3, a block diagram of a digital predistorter (DPD) 300, which may be used to implement the DPD 210 of FIG. 2, is shown. The DPD 300 is configured to receive the input signal x[m] in digital form (e.g., 12-14 bits per time sample), sampled at a sampling rate sufficient to represent the bandwidth (e.g., 20-120 MHz) of the input signal. In general, the input signal is complex, with the real and imaginary parts representing quadrature components of the signal to be transmitted. For example, the desired input is a baseband encoding (e.g., an OFDM encoding) of one or more channels of communication, for instance, for a cellular telephone transmitter (e.g., according to an LTE communication standard, or any other type of wireless communication technology). The input signal may be upsampled using upsampling/interpolating component 310 by, in some embodiments, a factor equal to one plus the degree of nonlinearity of interest in the transmit chain divided by two (e.g., if nonlinearity of interest is $7^{th}$ order, then upsampling by a factor of four is used), and then optionally filtered. Upsampling enables the DPD by shrinking the spectrum to avoid aliasing of undesirable harmonics in the target band.

In some examples, an optional LTI (Linear Time Invariant) filtering component 312 processes the signal after upsampling. The LTI filter is selected to mimic the long-term behavior of the elements of the transmit chain 240 of FIG. 2 (for example, a DAC, an LPF, etc.) For example, the fixed-coefficient reconstruction filter can mimic the zero-order hold properties of the DAC. The upsampled (and optionally filtered) input signal u[n] is then used to compute S basic signals, $w_1[n]$ through $w_S[n]$, each sampled at the upsampled rate, using a set of basis formation elements 320$a$-$s$, which include components that represent non-linear transformations (e.g., polynomial functions) of the input. The basis formation can incorporate polynomial function of the input, or alternatively non-polynomial function, for example, a polynomial $X|X|^2$, or a non-polynomial $(X|X|^2)/\text{avg}(|X|^2)$. The basis signals are applied to balanced polynomial computation element 330, or in alternative embodiments another form of non-linear combination, which outputs a combined signal z[n] at the upsampled rate. DPD coefficients that are determined or selected to weigh the components basis functions (resulting from the basis function processing) namely, $w_1[n]$ through $w_S[n]$ to achieve the predistortion of the signal that would result in removal of non-linear effects from the output signal produced by the transmit chain. In some examples, an adaptive procedure that employs an optimization process (such as a least-squares minimization procedure) may be used to derive DPD coefficients based on the basis functions used for the linearization system, the input signal, and the sampled (observed) output signal of the transmit chain. Further details regarding the use of an adaptive procedure(s) to determine DPD coefficients is provided in U.S. patent application Ser. No. 16/004,594, entitled "Linearization System," the content of which is hereby incorporated by reference in its entirety. In some embodiments, and as will be further described below, the DPD coefficients may be derived based on pre-determined sets of DPD coefficients (which may have been derived according to adaptive and/or optimization procedures based on input and output samples of a linearization system), e.g., using an interpolation technique. As additionally, shown in FIG. 3, the combined signal z[n] is then downsampled by downsampling/filtering component 340, and optionally further filtered in a LTI filtering component 342, for example, yielding the original sampling rate of the input signal x[m], to produce an output y[m] of the DPD 300.

In some examples, the DPD performs the transformation of the desired signal x[m] to the input y[m] of the transmit chain by using delay elements (not shown) to form a set of delayed versions of the desired signal, and then uses a non-linear polynomial function of those delayed inputs. In some examples, the non-linear function is a Volterra series:

$$y[n] = h_0 + \Sigma_p \Sigma_{\tau_1, \ldots, \tau_p} h_p(\tau_1, \ldots, \tau_p) \Pi_{j=1 \ldots p} x[n-\tau_j]$$

In some examples, the non-linear function is a reduced set of Volterra terms, for example a delay polynomial:

$$y[n] h_0 + \Sigma_p \Sigma_\tau h_p(\tau) x[n-\tau] |x[n-\tau]|^{(p-1)}$$

In some embodiments, to invert the non-linear effects of the transmit chain, a relatively large number of terms of such a series representation may be needed, and the coefficients of those terms (e.g., $h_p$ terms) need to be accurately set. The coefficients in such approaches may be continually updated to maintain good linearization. Approaches to such continual updating may include, for example, incremental updates using y[m] (the output of DPD 210), and/or observation of v(t) and other system characteristics, whose observed values may be reflective of load conditions, in response to which the DPD coefficients may be adjusted/varied.

As further shown in FIG. 2, the DPD 210 may be controlled using a controller to determine/compute DPD coefficients (shown as DPD coefficients Θ 220) to adjust the DPD 210 using such determined DPD coefficients. In some embodiments, the DPD coefficients Θ 220 are determined using a database of coefficients 230, and values that essentially characterize the operation "regime" (i.e., a class of physical conditions) of the transmit chain, and/or the load conditions. These values (e.g., quantitative or categorical digital variables) include environment variables 232 (e.g., temperature, transmitter power level, supply voltage, frequency band) and/or a part "signature" 234, which represents substantially invariant characteristics and which may be unique to the electronic parts of the transmit chain 240.

As noted, the load condition values, characterized or represented by a load metric (such as the VSWR value, or some other value) may be inferred from locally determined system characteristics, including the input signal power to the power amplifier 248, the output signal power of the power amplifier 248 (which may be determined using, for example, a power detector such as the power detector 120 of FIG. 1), and the bias current of the power amplifier 248. The system characteristic values used for inferring the load conditions, as well as other attributes/characteristics sensed or otherwise determined at the output of the transmit chain 240, may be provided to a coefficient estimator/interpolator 236 via a feedback receive chain 260.

The load metric corresponding to a particular set of system characteristic values does not necessarily need to be computed (but may be). Rather, in some embodiments, the correlation between different system characteristic values for the power amplifier system and load conditions may be determined or established at some earlier point of time (e.g., using an impedance tuner) to derive appropriate DPD coefficients. For example, the DPD coefficient sets may be computed so as to achieve some desired associated distortion measures/metrics that characterize the effects of the preprocessing, including an error vector magnitude, or EVM (defined as the square root of the mean error power divided by the square of the maximum constellation magnitude), the adjacent channel power ratio, or ACPR (defined as a ratio between the total power in adjacent channels (e.g., an intermodulation signal) to the desired channel's power, which is representative of the spreading of signal energy outside the desired signal band), or other types of distortion measures/metrics.

The coefficient interpolator 236 uses the various inputs it receives to access the coefficient database 232 and determine and output the corresponding DPD coefficients 220. A variety of approaches may be implemented by the coefficient estimator/interpolator 236, including selection and/or interpolation of coefficient values in the database according to the inputs, and/or applying a mathematical mapping of the input represented by values in the coefficient database. For example, in some embodiments, the estimator/interpolator 236 may be configured to select, from a plurality of sets of DPD coefficients (in the database 232), a DPD coefficient set associated with a pre-determined load metric value that most closely matches a load estimate corresponding to the system characteristics provided via the receive chain for the power amplifier system 200 (the actual load metric estimate may or may not be computed). In some embodiments, the DPD coefficients used to control/adjust the DPD 210 may be determined by selecting two or more sets of DPD coefficients from a plurality of sets of DPD coefficients (maintained in the database 232) based on the system characteristics (which correspond to a complex load metric estimate). An interpolated set of DPD coefficients may then be determined from the selected two or more sets of DPD coefficients. Further details regarding computation of DPD coefficients using a DPD coefficient database are provided in U.S. Pat. No. 9,590,668, entitled "Digital Compensator," the content of which is hereby incorporated by reference in its entirety.

Figure 4:
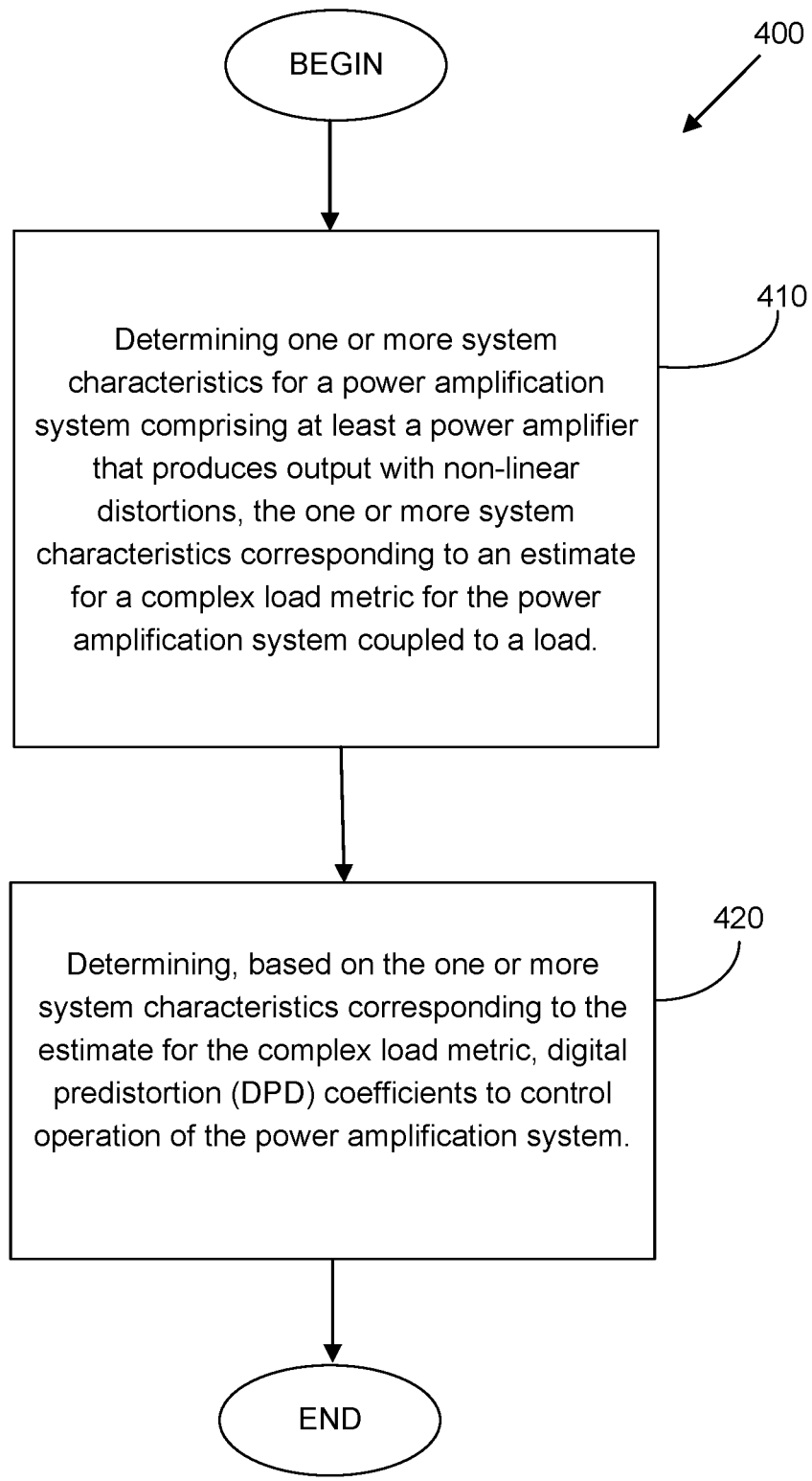
FIG. 4 is a flowchart of an example procedure to perform digital predistortion on signals provided to a power amplifier system.

With reference now to FIG. 4, a flowchart of an example procedure 400 to perform digital predistortion on signals provided to a controllable power amplification system (or parts thereof), such as the systems 100, 200 and 300 of FIGS. 1-3, is shown. The procedure 400 includes determining 410 one or more system characteristics for the power amplification system comprising at least a power amplifier that produces output with non-linear distortion, with the one or more system characteristics corresponding to an estimate for a complex load metric for the power amplification system coupled to a load. In some embodiments, the complex load metric may include a complex voltage standing wave ratio (VSWR) metric associated with load conditions for the power amplifier system resulting from the load. In such embodiments, the load metric comprising the complex VSWR metric may include, for example, a phase component and/or an amplitude component. The phase component can be indicative of which quadrant (or some smaller angular/radial span, depending on the desired radial resolution) of a Smith chart the phase component is included in. The phase component can thus facilitate selecting the pre-determined DPD coefficients associated with the phase component estimate corresponding to the one or more system characteristics determined for the power amplification system.

In some implementations, determining the one or more system characteristics may include determining input power, $P_{IN}$, of an input signal provided to the power amplification system, an output power, $P_{OUT}$, of an output of the power amplification system resulting from amplification operations performed on the input signal, and a bias current, $I_{PA}$, provided to the power amplification system. As noted, changes to the load conditions (including changes to the orientation and/or position of the power amplifier system relative to the load, changes to the load's environment and behavior, etc.) may cause resultant changes to the above system characteristics of $P_{OUT}$ and $I_{PA}$ (given a particular $P_{IN}$). This in turn may affect the load conditions for the system, thus requiring a change to the DPD coefficients to achieve a more optimal DPD behavior. Other system characteristics may be used in addition to the above-described system characteristics, or instead of one or more of the above-described system characteristics. As noted, the system characteristics generally do not include data that is based on RF feedback data that may have been provided, directly or indirectly, by the load interacting with the power amplification system. Alternatively, RF feedback (e.g., reflected RF waves from the load) may be used, in some implementations, to determine an estimate of the load conditions.

In some embodiments, the procedure 400 may further include deriving, based on the one or more system characteristics, the estimate for the load metric representative of at least a reactive component of the load condition for the power amplifier system coupled to the load. In other embodiments, derivation of the actual estimate of the complex load metric may not be required, and instead the DPD coefficients may be determined based on knowledge of the system characteristics (which are indicative of the current load conditions). In embodiments in which derivation of the complex load metric estimate is performed, deriving the estimate may include deriving the estimate for the complex load metric as a function of, for example $P_{IN}$, $P_{OUT}$, and $I_{PA}$.

Deriving the estimate for the load metric as a function of $P_{IN}$, $P_{OUT}$, and $I_{PA}$ may include mapping $P_{IN}$, $P_{OUT}$, and $I_{PA}$ to one or more of a plurality of pre-determined load metric values (such as VSWR). The association/mapping between one or more system characteristics and the load metric may have been determined during an earlier calibration stage (during which, the different DPD coefficient sets, which are respectively associated with different complex load metrics and system characteristics values, may also have been determined). Particularly, during the calibration stage (also referred to as the pre-run stage), which may have been performed at manufacture time of the power amplification system or prior to deployment of the power amplification system, a mapping of estimated VSWR (or some other load metric) as a function of, for example, $P_{IN}$, $P_{OUT}$, and $I_{PA}$ (or some other system characteristics) is established. In some embodiments, such a mapping procedure (performed during the calibration stage) is performed on a per-PA basis (although the procedure may be done on a per-device or per-system basis). For example, for a per-PA calibration procedure, a specific PA is tested and loaded with a physical device to vary true VSWR (e.g., using an impedance tuner that is configured to scan loading effects over some range of phases and/or magnitudes). For a set of pre-defined conditions, VSWR[1], ..., VSWR[N], DPD coefficients for that specific load condition are estimated and stored for use at runtime. Then, during runtime, an estimated load metric may be computed according to EstimatedVSWR=$f(P_{IN}, P_{OUT}, I_{PA})$ to identify, for example, the closest VSWR[n] to select the DPD coefficients associated therewith, or interpolate DPD coefficients from the DPD coefficients associated with multiple VSWR[n]. As discussed herein, an estimate of the complex load metric, such as EstimatedVSWR, need not necessarily be computed, but instead the combination of system characteristics can be directly used to access from a DPD coefficient database a set of coefficients that is associated with a combination of system characteristics closest to the determined system characteristics for the PA or power amplifier system. It is to be noted that other mapping functions, $f(\ )$, with different combinations of system characteristic arguments that are representative of at least a reactive component of a load condition, could be generated, and DPD coefficients for such mapping, e.g., for $f[1], ..., f[N]$, could then achieve the same effect of determining appropriate DPD coefficient for different load conditions. In some embodiments, one could use physical and/or data-driven techniques to derive alternative maps by, for example, determining the sensitivity of PA non-linearity to different measurements that are affected by loading effects. As noted, the above calibration procedure may be done on a per-power amplifier (PA) basis, a per-device or per-system basis (with each such device or system comprising one or more PA's), or on a per-device-type basis (i.e., use the same mapping for all PA's or devices that are of the same type).

With continued reference to FIG. 4, the procedure 400 further includes determining 420, based on the one or more system characteristics corresponding to the estimate for the load metric, digital predistortion (DPD) coefficients to control operation of the power amplification system. Controlling operation of the power amplification system may include compensating for the nonlinear behavior of the power amplifier system. In some implementations, determining the DPD coefficients may include selecting, from a plurality of sets of DPD coefficients, a DPD coefficient set associated with a pre-determined load metric value that most closely matches the estimate for the load metric (or which most closely matches the combination of system characteristics used for selecting the appropriate set of DPD coefficients). The determination of closeness may be performed through a computation of some distance measure between pre-determined system characteristics and/or load metrics that are associated with each of the sets of DPD coefficients, and the currently determined system characteristics and/or the corresponding load metric. Other processes or techniques for deriving a closeness measure or metric may also be used.

As noted, the sets of DPD coefficients may be arranged/maintained in a coefficient database (such as the database 230 of FIG. 2). Such a database may have been created/generated at earlier calibration stage to determine DPD coefficients that are associated (parameterized) with respective load metrics and/or selected combination of system characteristics representative or indicative of load conditions (with such load conditions comprising at least a reactive (imaginary) component of a complex quantity used to represent load conditions). In some embodiments, determining the DPD coefficients to control the operation of the power amplifier system may include selecting from a plurality of sets of DPD coefficients two or more sets of DPD coefficients, and determining an interpolated set of DPD coefficients from the selected two or more sets of DPD coefficients for use with the power amplifier system. For example, several sets of DPD coefficients may be selected based on some distance criterion used to evaluate the closeness of a particular set of system characteristics and/or load condition estimates, to pre-determined system characteristics and/or load condition estimates associated with the DPD coefficient sets. An interpolation operation (averaging, weighted averaging, or some other interpolative scheme) is then applied to the DPD coefficients in the different selected coefficient sets to derive the resultant interpolated set.

It is to be noted that to improve DPD performance, it may be sufficient to know the quadrant, or few specific dividing phase sections, of a phase component of the load condition metric (in some scenarios, the division of the phase sections does not always follow traditional quadrants). Hence, detecting the phase of a VSWR metric (for example) with 2-bit precision could be sufficient for many applications. Further, the higher the precision of the mapping procedure, the more of an improvement for DPD operations is achieved. Also, the number of calibration points for the coefficient database may depend on performance requirements.

The description above focuses on complex values to represent load condition metrics (e.g., using a complex VSWR quantity or metric). Other quantities or metrics, which provide a mathematical representation of phase/amplitude quantities, reactive/resistive quantities (which may be represented via imaginary and real parts), other similar representations for load conditions, and/or representations that indicate the load situations (e.g. reflection/transmission wave powers, reflection/transmission coefficients, S-parameters), may also be used. For example, reflection coefficients represent the wave reflections at the different media/surface/load, and can be used to derive load conditions. In some embodiments, representation of load conditions of the implementations described herein may be provided using at least the phase part or the reactive part of a representation of a load condition metric. As noted herein, different types of load condition metrics may be used (i.e., other than VSWR), and may be inferred based on different combinations of local power amplifier system characteristics. Such combinations of system characteristics may exclude data determined based on RF feedback from a load.

In some embodiments, the procedure 400 may further include other operations, such as performing the DPD operations used in conjunction with the power amplification system. Thus, in some embodiments, the procedure 400 may further include processing an input signal to the power amplification system to produce a compensated signal according to the DPD coefficients. Such processing may include applying a set of basis functions to the input signal to produce respective signal components corresponding to the set of basis functions, applying the DPD coefficients to the respective signal components to produce resultant predistorted signal components, and combining the resultant predistorted signal components to produce a predisorted signal provided to a transmit chain of the power amplification system. In some examples, applying the set of basis functions to the input signals may include performing one or more non-linear transformations of the input signal (e.g., according to respective one or more polynomial functions) to produce the respective signal components. Performing the non-linear transformation according to the polynomial functions may include accepting an input u and producing an output of the form $|u|^k$ or $u|u|^k$ for a positive integer k. In some embodiments, other non-limited types of basis functions (e.g., not based on polynomials), which may also be non-linear basis functions, may be used.

Figure 5:
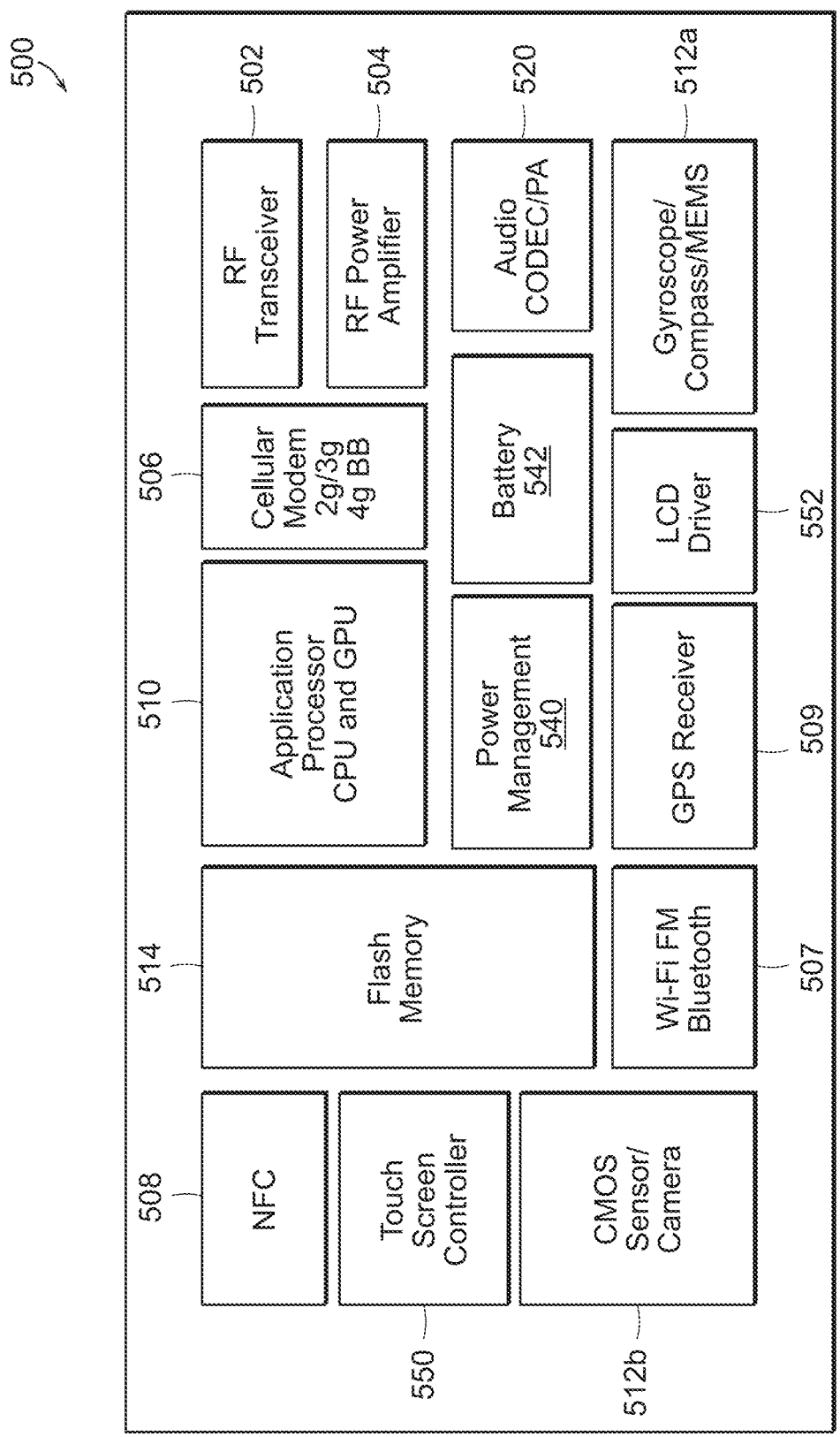
FIG. 5 is a block diagram of an example device which may be used to implement, or which may include, the systems of FIG. 1, 2, or 3.

With reference next to FIG. 5, a schematic diagram of an example device 500 (e.g., a mobile device or handset, although a similar configuration may also be used to implement a network node, such as a WLAN access point or a WWAN base station, etc.), which may be used to implement, or which may include, the systems 100, 200, or 300 depicted in FIGS. 1-3, respectively, is shown. It is to be noted that one or more of the modules and/or functions illustrated in the example device of FIG. 5 may be further subdivided, or two or more of the modules or functions illustrated in FIG. 5 may be combined. Additionally, one or more of the modules or functions illustrated in FIG. 5 may be excluded. The various modules and components of the device 500 may be connected through a bus or through other electrical connections and interfaces (not shown in FIG. 5).

The example device 500 may include an RF transceiver 502 (also referred to as an RF communication module) comprising one or more RF transceivers that may be connected to one or more antennas and to an RF front end unit comprising, for example, an RF power amplifier 504, and a cellular modem 506. The RF amplifier may include the amplification and digital predistortion circuitry to mitigate non-linear behavior caused by the amplifier or other elements of a transmit chain. The modem circuitry implemented by the cellular modem 506 is generally configured to perform modulation and demodulation operations for wireless signals in various bands and for various communication protocols (including 2G, 3G, 4G, 5G, and various other communication technologies in licensed and unlicensed bands). The RF front end circuitry, which may comprise the blocks 504 and 506 depicted in FIG. 5, may thus include power amplifiers, LNAs, digital-to-analog converters, analog-to-digital converters, filters, switches and other RF front-end modules, and, in some embodiments, at least some of the RF front end modules may be arranged to realize, at least in part, the system implementations 100, 200, or 300 described herein. The transceivers of the RF transceiver block 502 may comprise suitable devices, hardware, and/or software for communicating with and/or detecting signals to/from a network or remote devices. In some embodiments, the RF transceiver 502 may support wireless LAN communication (e.g., WLAN, such as WiFi-based communications) to thus cause the device 500 to be part of a WLAN. As noted, in some embodiments, the RF transceiver 502 may also support the device 500 to communicate with one or more cellular access points (also referred to as a base station), which may be used for wireless voice and/or data communication. The transceiver 502 may be used to communicate according to any type of WWAN protocol, including any 3GPP or IEEE standards (implemented over licensed and unlicensed frequency bands).

In some implementations, short range communication may be realized through dedicated circuitry such as the circuitry implemented by a WiFi FM Bluetooth module 507. The module 507 may thus be configured to allow the device 400 to communicate with in-range remote devices configured according to any short-range communication protocol. In addition, the device 500 may also include a wired network connection (e.g., implemented using a USB port, or some other wired port) to communicate with another device. Another communication module that may be included with the device 500 is a near-field communication (NFC) module 508 configured to allow communication with neighboring device according to NFC protocols. In some variations, the device 500 may also include a GPS receiver 509 connected to one or more antennas, and configured to receive satellite signals. The GPS receiver 509 may comprise any suitable hardware and/or software for receiving and processing GPS signals from satellite vehicles. The GPS receiver 509 may request information as appropriate from the other systems, and may perform the computations necessary to determine the device's 500 position using, in part, measurements obtained by any suitable satellite positioning system (SPS) procedure. Such positioning information may be used, for example, to determine the location and motion of the device 500.

With continued reference to FIG. 5, the device 500 may include one or more sensors that communicate, through wired or wireless communication links, with a controller/processor 510 (comprising, for example, an application processor CPU and GPU). The one or more sensors may include motion sensors (also referred to as orientation or inertial sensors), such as a gyroscope/compass sensor 512a, that may be implemented using micro-electro-mechanical systems (MEMS) technology. Other examples of motion sensors include an accelerometer, a magnetometer, etc. Another type of sensor that may be used is an audio sensor (e.g., a microphone) to record voice or sound information (which may then be converted to audio data via an audio CODEC/PA module 520, with the audio data then optionally transmitted to a remote device via the front end circuitry and the RF transceiver 502 or one of the other communication modules of the device 500). Also illustrated in FIG. 5 is a CMOS sensor/camera 512b configured to capture and record optical/light signals to produce still or moving images. Other types of sensors may also be included with the device 500.

The controller/processor 510 may be connected to the various communication modules and/or the front end circuitry, and to the various sensors. As noted, the controller may include one or more microprocessors, microcontrollers, and/or digital signal processors that provide processing functions, as well as other computation and control functionality. The device 500 may also include special purpose logic circuitry, e.g., an FPGA (field programmable gate array), an ASIC (application-specific integrated circuit), a DSP processor, a graphics processing unit (GPU), an accelerated processing unit (APU), an application processor, customized dedicated circuitry, etc., to implement, at least in part, the processes and functionality for the device 500. The controller 510 may be coupled to a memory 514 (shown in FIG. 5 as flash memory) for storing data and software instructions for executing programmed functionality within the device. Generally speaking, a computer accessible storage medium may include any non-transitory storage media accessible by a computer during use to provide instructions and/or data to the computer. For example, a computer accessible storage medium may include storage media such as magnetic or optical disks and semiconductor (solid-state) memories, DRAM, SRAM, etc.

The device 500 may be configured to (e.g., via hardware resident in the device and/or software modules/applications provided on the memory 514) to implement digital predistortion operations, including the processes described in relation to FIG. 4. For example, the device 500 may be configured to measure or infer the complex load metrics (such as VSWR) representative of load conditions (due to a load coupled to the device) based on bias current, and input and output power of the power amplifier (e.g., the RF power amplifier 504 of the device 500), and to determine DPD coefficients based, at least in part, the determined complex load metric. The memory 514 may be on-board the controller 510 (e.g., within the same IC package), and/or may be external memory to the processor and coupled thereto over a data bus.

The example device 500 may further include a user interface which provides any suitable interface systems, such as a microphone/speaker (which may be included with the Audi CODEC/PA module 520), keypad or a touchscreen 550 (or some other user-interface input mechanism), and a display 552 (shown as LCD Driver) that allows user interaction with the device 500. Such a user interface, be it an audiovisual interface (e.g., a display and speakers), or some other type of interface (visual-only, audio-only, tactile, etc.), configured to provide status data, alert data, and so on, to a user using the device 500. The microphone/speaker facilitates for voice communication functionality, and may also include or be coupled to a speech synthesizer (e.g., a text-to-speech module) that can convert text data to audio speech so that the user can receive audio notifications. Such a speech synthesizer may be a separate module, or may be integrally coupled to the microphone/speaker or to the controller 510 of the device of FIG. 5. The input interface (that includes the touchscreen controller 550) may further include suitable buttons for user input. The display (controlled by the LCD Driver 552) may include any suitable display, such as, for example, a backlit LCD display.

The device 500 may further include a power management unit 540 that controls power consumption of the device provided through a power storage device 542 (e.g., a battery) coupled to the power management unit. In some embodiments, the power management unit 540 may include (or may regulate) a power conversion module that receives and regulates power from an outside source (e.g., AC power), with such received power being used to recharge the battery 542.

The above implementations, as illustrated in FIGS. 1-6, are applicable to a wide range of technologies that include RF technologies (including WWAN technologies, such as cellular technologies, and WLAN technologies), satellite communication technologies, cable modem technologies, wired network technologies, optical communication technologies, and all other RF and non-RF communication technologies. The implementations described herein encompass all techniques and embodiments that pertain to use of digital predistortion in various different communication systems.

In some implementations, a computer accessible non-transitory storage medium includes a database (also referred to a "design structure" or "integrated circuit definition dataset") representative of a system including some or all of the components of digital predistortion implementations, based on load conditions inferred from local measurements. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates which also represents the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, the database may itself be the netlist (with or without the synthesis library) or the data set.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate in the context of the systems, devices, circuits, methods, and other implementations described herein.

As used herein, including in the claims, "or" or "and" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

Although particular embodiments have been disclosed herein in detail, this has been done by way of example for purposes of illustration only, and is not intended to be limiting with respect to the scope of the appended claims, which follow. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

What is claimed is:

1. A method for digital predistortion comprising:
   determining one or more system characteristics for a power amplification system comprising at least a power amplifier that produces output with non-linear distortions, wherein the one or more system characteristics include a representation of an estimate for a complex load metric for the power amplification system coupled to a load, wherein the representation of the estimate for the complex load metric is inferred from determined local characteristics of the power amplification system that exclude data based on feedback from the load; and
   determining, based on the one or more system characteristics that include the representation of the estimate for the complex load metric inferred from the determined local characteristics of the power amplification system, digital predistortion (DPD) coefficients to control operation of the power amplification system.

2. The method of claim 1, wherein the complex load metric comprises a complex voltage standing wave ratio (VSWR) metric associated with load conditions for the power amplification system resulting from the load.

3. The method of claim 2, wherein the complex load metric comprising the complex VSWR metric comprises a phase component and an amplitude component.

4. The method of claim 1, wherein determining the one or more system characteristics comprises:
determining input power, $P_{IN}$, of an input signal provided to the power amplification system, an output power, $P_{OUT}$, of an output of the power amplification system resulting from amplification operations performed on the input signal, and a bias current, $I_{PA}$, provided to the power amplification system.

5. The method of claim 4, wherein determining the one or more system characteristics further comprises:
determining a parameter representative of power added efficiency based on a relationship of $P_{IN}$, $P_{OUT}$, and $I_{PA}$.

6. The method of claim 4, further comprising:
deriving, based on the one or more system characteristics, the estimate for the complex load metric for the power amplification system coupled to the load.

7. The method of claim 1, wherein determining, based on the one or more system characteristics corresponding to the estimate for the complex load metric, the DPD coefficients to control the operation of the power amplification system comprises:
selecting, from a plurality of sets of DPD coefficients, a DPD coefficient set associated with a pre-determined complex load metric value that most closely matches the estimate for the load metric.

8. The method of claim 1, wherein determining, based on the one or more system characteristics corresponding to the estimate for the complex load metric, the DPD coefficients to control the operation of the power amplification system comprises:
selecting from a plurality of sets of DPD coefficients, based on the one or more system characteristics corresponding to the estimate for the complex load metric, two or more sets of DPD coefficients; and
determining an interpolated set of DPD coefficients from the selected two or more sets of DPD coefficients for use with the power amplification system.

9. The method of claim 1, wherein determining the plurality of system characteristics for the power amplification system comprises:
determining the one or more system characteristics for the power amplification system without RF feedback from the load.

10. The method of claim 1, further comprising:
processing an input signal to the power amplification system to produce a compensated signal according to the DPD coefficients, including:
applying a set of basis functions to the input signal to produce respective signal components corresponding to the set of basis functions,
applying the DPD coefficients to the respective signal components of the set of basis functions to produce resultant predistorted signal components, and
combining the resultant predistorted signal components to produce a predistorted signal provided to a transmit chain of the power amplification system.

11. The method of claim 10, wherein applying the set of basis functions to the input signals comprises:
performing one or more non-linear transformations of the input signal to produce the respective signal components.

12. The method of claim 11, wherein performing the non-linear transformation comprises:
performing the non-linear transformations according to respective polynomial functions, including accepting an input u and producing an output of the form $|u|^k$ or $u|u|^k$ for a positive integer k.

13. The method of claim 1, wherein determining the one or more system characteristics comprises:
measuring at the power amplification system an input power, $P_{IN}$, of an input signal provided to the power amplification system, an output power, $P_{OUT}$, of an output of the power amplification system resulting from amplification operations performed on the input signal, and a bias current, $I_{PA}$, provided to the power amplification system; and
deriving the representation of the estimate of the complex load metric as a function of $P_{IN}$, $P_{OUT}$, and, $I_{PA}$, without requiring feedback measurements from the load.

14. A method for digital predistortion comprising:
determining one or more system characteristics for a power amplification system comprising at least a power amplifier that produces output with non-linear distortions, wherein the one or more system characteristics include a representation of an estimate for a complex load metric for the power amplification system coupled to a load, wherein determining the one or more system characteristics comprises determining input power, $P_{IN}$, of an input signal provided to the power amplification system, an output power, $P_{OUT}$, of an output of the power amplification system resulting from amplification operations performed on the input signal, and a bias current, $I_{PA}$, provided to the power amplification system;
deriving, based on the one or more system characteristics, the estimate for the complex load metric for the power amplification system coupled to the load, wherein deriving the estimate for the complex load metric comprises deriving the estimate for the complex load metric as a function of $P_{IN}$, $P_{OUT}$, and $I_{PA}$; and
determining, based on the one or more system characteristics that include the representation of the estimate for the complex load metric, digital predistortion (DPD) coefficients to control operation of the power amplification system.

15. The method of claim 14, wherein deriving the estimate for the complex load metric as a function of $P_{IN}$, $P_{OUT}$, and $I_{PA}$ comprises:
mapping $P_{IN}$, $P_{OUT}$, and $I_{PA}$ to one or more of a plurality of pre-determined complex load metric values.

16. A power amplifier system comprising:
at least one power amplifier that produces output with non-linear distortions; and
a controller coupled to the at least one power amplifier, the controller configured to:
determine one or more system characteristics for the power amplification system, wherein the one or more system characteristics include a representation of an estimate for a complex load metric for the power amplification system coupled to a load, wherein the representation of the estimate for the complex load metric is inferred from determined local characteristics of the power amplification system that exclude data based on feedback from the load; and determine, based on the one or more system characteristics that include the representation of the estimate for the complex load metric inferred from the determined local characteristics of the power amplification system, digital predistortion (DPD) coefficients to control operation of the power amplification system.

17. The power amplifier system of claim 16, wherein the complex load metric comprises a complex voltage standing wave ratio (VSWR) metric associated with load conditions for the power amplifier system resulting from the load.

18. The power amplifier system of claim 17, wherein the complex load metric comprising the complex VSWR metric comprises a phase component and an amplitude component.

19. The power amplifier system of claim 16, wherein the controller configured to determine the one or more system characteristics is configured to:
  determine input power, $P_{IN}$, of an input signal provided to the at least one power amplifier, an output power, $P_{OUT}$, of an output of the at least one power amplifier resulting from amplification operations performed on the input signal, and a bias current, $I_{PA}$, provided to the at least one power amplifier; and
  determine a parameter representative of power added efficiency based on a relationship of $P_{IN}$, $P_{OUT}$, and $I_{PA}$.

20. The power amplifier system of claim 19, further comprising:
  a power detector coupled to the output of the at least one power amplifier, and configured to measure the output power, $P_{OUT}$, of the at least one power amplifier.

21. The power amplifier system of claim 19, wherein the controller is further configured to:
  derive the estimate for the complex load metric as a function of $P_{IN}$, $P_{OUT}$, and $I_{PA}$.

22. The power amplifier system of claim 21, wherein the controller configured to derive the estimate for the complex load metric is configured to:
  map $P_{IN}$, $P_{OUT}$, and $I_{PA}$ to one or more of a plurality of pre-determined complex load metric values.

23. The power amplifier system of claim 16, wherein the controller configured to determine, based on the one or more system characteristics corresponding to the estimate for the complex load metric, the DPD coefficients to control the operation of the power amplification system is configured to:
  select, from a plurality of sets of DPD coefficients, a DPD coefficient set associated with a pre-determined complex load metric value that most closely matches the estimate for the load metric.

24. The power amplifier system of claim 16, wherein the controller configured to determine, based on the one or more system characteristics corresponding to the estimate for the complex load metric, the DPD coefficients to control the operation of the power amplification system is configured to:
  select from a plurality of sets of DPD coefficients, based on the one or more system characteristics corresponding to the estimate for the complex load metric, two or more sets of DPD coefficients; and
  determine an interpolated set of DPD coefficients from the selected two or more sets of DPD coefficients for use with the power amplification system.

25. The power amplifier system of claim 16, wherein the controller further comprises a digital predistorter configured to:
  process an input signal to the power amplification system to produce a compensated signal according to the DPD coefficients, including:
    apply a set of basis functions to the input signal to produce respective signal components corresponding to the set of basis functions,
    apply the DPD coefficients to the respective signal components of the set of basis functions to produce resultant predistorted signal components, and
    combine the resultant predistorted signal components to produce a predisorted signal provided to a transmit chain of the power amplification system.

26. A design structure encoded on a non-transitory machine-readable medium, said design structure comprising elements that, when processed in a computer-aided design system, generate a machine-executable representation of a power amplifier system comprising:
  an amplifier circuit that produces output with non-linear distortions; and
  a control circuit coupled to the amplifier circuit, the control circuit configured to:
    determine one or more system characteristics for the power amplifier system, wherein the one or more system characteristics include a representation of an estimate for a complex load metric for the power amplification system coupled to a load, wherein the representation of the estimate for the complex load metric is inferred from determined local characteristics of the power amplification system that exclude data based on feedback from the load; and
    determine, based on the one or more system characteristics that include the representation of the estimate for the complex load metric inferred from the determined local characteristics of the power amplification system, digital predistortion (DPD) coefficients to control operation of the power amplification system.

27. A non-transitory computer readable media programmed with a set of computer instructions executable on a processor that, when executed, cause the operations comprising:
  determining one or more system characteristics for a power amplification system comprising at least a power amplifier that produces output with non-linear distortions, wherein the one or more system characteristics include a representation of an estimate for a complex load metric for the power amplification system coupled to a load, wherein the representation of the estimate for the complex load metric is inferred from determined local characteristics of the power amplification system that exclude data based on feedback from the load; and
  determining, based on the one or more system characteristics that include the representation of the estimate for the complex load metric inferred from the determined local characteristics of the power amplification system, digital predistortion (DPD) coefficients to control operation of the power amplification system.

* * * * *